(12) United States Patent
Kim

(10) Patent No.: US 12,128,824 B2
(45) Date of Patent: Oct. 29, 2024

(54) AUTOMATIC CONTROL APPARATUS AND METHOD OF IN-VEHICLE INFOTAINMENT VOLUME

(71) Applicant: HYUNDAI MOBIS CO., LTD., Seoul (KR)

(72) Inventor: Jeong Hoon Kim, Yongin-si (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 92 days.

(21) Appl. No.: 18/055,816

(22) Filed: Nov. 15, 2022

(65) Prior Publication Data

US 2023/0150427 A1     May 18, 2023

(30) Foreign Application Priority Data

Nov. 16, 2021   (KR) .................. 10-2021-0157654

(51) Int. Cl.
*G08G 1/14*     (2006.01)
*B60Q 9/00*     (2006.01)
*G06F 3/16*     (2006.01)

(52) U.S. Cl.
CPC ............. *B60Q 9/007* (2013.01); *B60Q 9/005* (2013.01); *B60Q 9/006* (2013.01); *G06F 3/165* (2013.01)

(58) Field of Classification Search
USPC ........ 340/932.2, 989, 995.13, 426.1, 426.22, 340/426.23, 426.26, 436, 457, 472, 516, 340/525, 539.22, 691.6, 692
See application file for complete search history.

(56) References Cited

U.S. PATENT DOCUMENTS

| | | | |
|---|---|---|---|
| 9,893,697 B1* | 2/2018 | Churchwell | G10L 21/0316 |
| 2011/0082613 A1* | 4/2011 | Oetiker | B60W 10/20 701/25 |
| 2013/0229524 A1* | 9/2013 | Vovkushevsky | B60R 1/27 348/148 |
| 2015/0179075 A1* | 6/2015 | Lee | G08G 1/165 340/932.2 |
| 2018/0162446 A1* | 6/2018 | Mikuriya | B62D 15/028 |
| 2018/0180731 A1* | 6/2018 | Inoue | G01S 15/931 |
| 2019/0205831 A1* | 7/2019 | Kanaoka | H04W 4/021 |
| 2019/0329777 A1* | 10/2019 | Rajab | G08G 1/166 |
| 2021/0034821 A1* | 2/2021 | Choi | G10L 15/22 |

* cited by examiner

*Primary Examiner* — Daniel Previl
(74) *Attorney, Agent, or Firm* — DLA Piper LLP US

(57) ABSTRACT

An automatic control apparatus and a method of in-vehicle infotainment volume are proposed. The automatic control apparatus is configured to detect obstacle (people or object) around a vehicle using a parking assistance system sensor, and to adjust the playback volume of an in-vehicle infotainment (IVI) to be automatically reduced when an obstacle is detected around the vehicle, and to automatically adjust the playback volume of the IVI during not only reversing but also forward moving of the vehicle.

17 Claims, 4 Drawing Sheets

AUTOMATIC CONTROL APPARATUS AND METHOD OF IN-VEHICLE INFOTAINMENT VOLUME

CROSS REFERENCE TO RELATED APPLICATION

The present application claims priority to Korean Patent Application No. 10-2021-0157654, filed Nov. 16, 2021, the entire contents of which is incorporated herein for all purposes by this reference.

BACKGROUND OF THE DISCLOSURE

Field of the Disclosure

The present disclosure relates to an apparatus and a method for automatically controlling in-vehicle infotainment volume and, more particularly, to an apparatus and a method for automatically controlling in-vehicle infotainment volume, which are configured to automatically adjust the playback volume of an in-vehicle infotainment by using information of a parking assistance system sensor.

Description of the Related Art

An in-vehicle infotainment (IVI) is an apparatus for a vehicle providing multimedia entertainment.

The IVI is a generic term for an in-vehicle environment that can provide both information and entertainment necessary for driving to passengers at the same time, and serves to provide a driver with the convenience of listening to music or other media while driving.

In order to maximize this convenience, a function of automatically adjusting a playback volume is provided in the IVI, and as an example, the IVI automatically raises the volume during driving at high speeds, or automatically reduces the volume during reversing.

The IVI provides the convenience to the driver, but also negatively affects the concentration and the safety of the driver.

In other words, when driving or parking starts, the playback volume of the IVI is high, and even if there are people or objects around the vehicle, the probability that the driver will not be aware of the people or objects around the vehicle increases, and in this case, the concentration and the safety of the driver may be negatively affected. For this reason, a safety function by which the playback volume is automatically reduced is provided while the vehicle is reversed.

However, the function by which the playback volume is automatically reduced is not provided while the vehicle is driven forward, and specifically, as the IVI operates without considering environmental conditions around the vehicle, an unexpected safety accident may occur.

The foregoing is intended merely to aid in the understanding of the background of the present disclosure, and is not intended to mean that the present disclosure falls within the purview of the related art that is already known to those skilled in the art.

SUMMARY

The present disclosure is intended to provide an apparatus and a method for automatically controlling in-vehicle infotainment volume, which are configured to detect an obstacle (people or object) around a vehicle using a sensor of a parking distance warning (PDW) system and to automatically reduce the playback volume of an in-vehicle infotainment when an obstacle is detected, to further enhance the safety function of the vehicle by automatically adjusting the playback volume during not only reversing but also forward moving.

In order to achieve the above objective, according to one aspect of the present disclosure, there is provided an automatic control apparatus of in-vehicle infotainment volume, the automatic control apparatus including: a parking assistance system sensor mounted in a vehicle and configured to detect an obstacle around the vehicle; an advanced driver assistance systems park (ADAS PRK) configured to calculate a distance between the vehicle and the obstacle around the vehicle by using information of the parking assistance system sensor; and an in-vehicle infotainment (IVI) head unit configured to receive information of the ADAS PRK and to automatically control volume of a sound system mounted in the vehicle.

The parking assistance system sensor may include an ultrasonic sensor and a camera sensor that may be configured to be detectable an obstacle and a space around the vehicle.

The ADAS PRK may be configured to preset the surrounding of the vehicle by dividing the surrounding of the vehicle into a plurality of sections along omnidirectional circumference of the vehicle, and to calculate a distance value between the vehicle and an obstacle located in each of the sections based on the information of the parking assistance system sensor to preset the distance value into for each level, and to store a distance between the vehicle and an obstacle located closest to the vehicle in for each section into a memory to transmit the distance to the IVI head unit.

The IVI head unit may be configured to adjust playback volume of an in-vehicle infotainment (IVI) and warning sound volume by the sound system.

When the playback volume of the IVI is adjusted to be lowered, the warning sound volume may be adjusted to be raised in inverse proportion to the lowered playback volume of the IVI.

The IVI head unit may be configured to control the sound system such that a playback volume of the IVI may be lowered to a preset volume level automatically, only when a first condition in which a vehicle-linked volume adjustment function is preset (on) in a set menu of the IVI, a second condition in which a volume level of the currently playing IVI is higher than a reference level, a third condition in which a current vehicle speed is less than or equal to a reference speed, and a fourth condition in which a minimum distance value between the vehicle and an obstacle, the distance value being transmitted from the ADAS PRK, is less than a reference distance value are all satisfied.

When any one of the first to fourth conditions is unsatisfied, the IVI head unit may control the sound system to continuously maintain the volume level of the currently playing IVI.

Only when a fifth condition in which the volume level of the currently playing IVI is adjusted to be automatically lowered to the volume level preset by the IVI head unit, a sixth condition without a change in volume level by manipulation of a user after the volume level of the IVI is adjusted to be automatically lowered by the IVI head unit, and a seventh condition in which the minimum distance value between the vehicle and the obstacle transmitted from the ADAS PRK is larger than the reference distance value are all satisfied, the playback volume of the IVI may be automatically recovered to an existing volume level before being lowered by the IVI head unit.

When any one of the fifth condition to the seventh condition is unsatisfied, the IVI head unit may control the volume level of the IVI to be continuously maintained in the automatically lowered volume level.

The sound system may include an amplifier and a speaker mounted in the vehicle.

According to another aspect of the present disclosure, there is provided an automatic control method of in-vehicle infotainment volume, the automatic control method including: detecting an obstacle around a vehicle by using an ultrasonic sensor and a camera sensor mounted in the vehicle; calculating, when the obstacle is detected around the vehicle, by an advanced driver assistance systems park (ADAS PRK), a distance between the vehicle and the obstacle; and adjusting, by an in-vehicle infotainment (IVI) head unit receiving information from the ADAS PRK, volume of a sound system mounted in the vehicle, automatically.

The ADAS PRK may be configured to preset the surrounding of the vehicle by dividing the surrounding of the vehicle into a plurality of sections along omnidirectional circumference of the vehicle, and to calculate a distance value between the vehicle and an obstacle located in each of the sections based on the information of the ultrasonic sensor and the camera sensor to preset the distance value into for each level, and to store a distance between the vehicle and an obstacle located closest to the vehicle in for each section into a memory and to transmit the distance to the IVI head unit.

A playback volume of an in-vehicle infotainment (IVI) and warning sound volume may be automatically adjusted by the sound system.

When the playback volume of the IVI is adjusted to be lowered, the warning sound volume may be adjusted to be raised in inverse proportion to the lowered playback volume of the IVI.

Only when a first condition in which a vehicle-linked volume adjustment function is preset (on) in a set menu of the IVI, a second condition in which a volume level of the currently playing IVI is higher than a reference level, a third condition in which a current vehicle speed is less than or equal to a reference speed, and a fourth condition in which a minimum distance value between the vehicle and an obstacle, the distance value being transmitted from the ADAS PRK, is less than a reference distance value are all satisfied, the playback volume of the IVI may be controlled to be lowered to the preset volume level automatically.

When any one of the first condition to the fourth condition is unsatisfied, a volume level of the currently playing IVI may be continuously maintained.

Only when a fifth condition in which the volume level of the currently playing IVI is adjusted to be automatically lowered to the volume level preset by the IVI head unit, a sixth condition without a change in volume level by manipulation of a user after the volume level of the IVI is adjusted to be automatically lowered by the IVI head unit, and a seventh condition in which a minimum distance value between the vehicle and an obstacle transmitted from the ADAS PRK is larger than the reference distance value are all satisfied, the playback volume of the IVI may be automatically recovered to an existing volume level before being lowered.

When any one of the fifth condition to the seventh condition is unsatisfied, the volume level of the IVI may be continuously maintained in the automatically lowered volume level.

The playback volume of the IVI may be automatically adjusted in both reversing and forward moving of the vehicle.

According to the present disclosure, the automatic control apparatus and the automatic control method are configured to detect an obstacle (people, object, etc.) around the vehicle using the parking assistance system sensor, and to automatically reduce the playback volume of the in-vehicle infotainment (IVI) when an obstacle is detected. Accordingly, the safety while driving can be further enhanced, and specifically, the safety of a driver and pedestrians can be increased, and the convenience of the driver can be improved.

Furthermore, according to the embodiment of the present disclosure, the automatic control apparatus and method are configured to automatically adjust the playback volume of the IVI not only in reversing but also in forward moving through the sound system controlled by the IVI head unit, so that there is an effect in that the safety while driving can be further enhanced.

BRIEF DESCRIPTION OF THE DRAWINGS

FIG. 3 is a flowchart in which the playback volume of an in-vehicle infotainment (IVI) is controlled to be automatically lowered to an preset volume level automatically, and FIG. 4 is a flowchart in which the lowered playback volume of the IVI is controlled to be automatically recovered to an existing volume level before being lowered.

DETAILED DESCRIPTION OF THE DISCLOSURE

Figure 1:
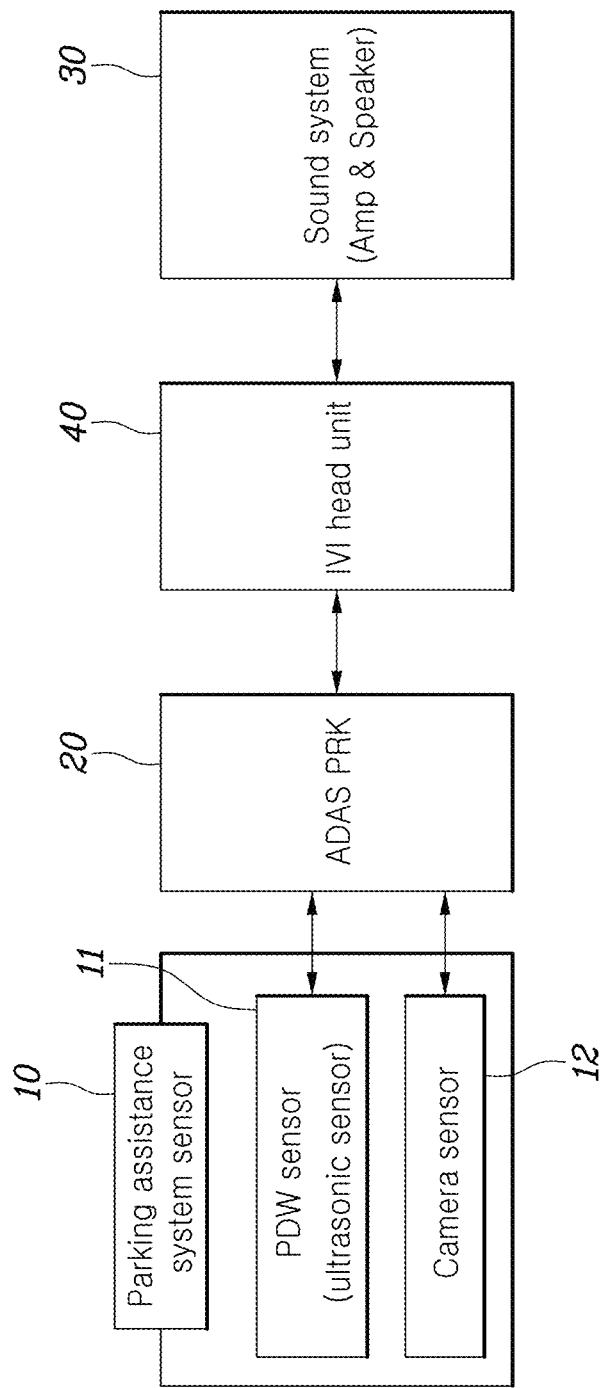
FIG. 1 is a block diagram of a schematic configuration showing automatic control apparatus and method of the in-vehicle infotainment volume according to the present disclosure.

In the following description, the structural or functional description specified to exemplary embodiments according to the concept of the present disclosure is intended to describe the exemplary embodiments, so it should be understood that the present disclosure may be variously embodied, without being limited to the exemplary embodiments.

Embodiments described herein may be changed in various ways and various shapes, so specific embodiments are shown in the drawings and will be described in detail in this specification. However, it should be understood that the exemplary embodiments according to the concept of the present disclosure are not limited to the embodiments which will be described hereinbelow with reference to the accompanying drawings, but all of modifications, equivalents, and substitutions are included in the scope and spirit of the disclosure.

It will be understood that, although the terms first and/or second, etc. may be used herein to describe various elements, these elements should not be limited by these terms. These terms are only used to distinguish one element, from another element. For instance, a first element discussed below could be termed a second element without departing from the teachings of the present disclosure. Similarly, the second element could also be termed the first element.

It is to be understood that when one element is referred to as being "connected to" or "coupled to" another element, it may be connected directly to or coupled directly to another element or be connected to or coupled to another element, having the other element intervening therebetween. On the other hand, it is to be understood that when one element is referred to as being "connected directly to" or "coupled directly to" another element, it may be connected to or coupled to another element without the other element intervening therebetween. Further, the terms used herein to describe a relationship between elements, that is, "between", "directly between", "adjacent", or "directly adjacent" should be interpreted in the same manner as those described above.

The terminology used herein is for the purpose of describing particular embodiments only and is not intended to limit the present disclosure. Singular forms are intended to include plural forms unless the context clearly indicates otherwise. It will be further understood that the terms "comprises" or "have" used in this specification, specify the presence of stated features, steps, operations, components, parts, or a combination thereof, but do not preclude the presence or addition of one or more other features, numerals, steps, operations, components, parts, or a combination thereof.

Unless otherwise defined, all terms including technical and scientific terms used herein have the same meaning as commonly understood by those skilled in the art to which the present disclosure belongs. It must be understood that the terms defined by the dictionary are identical with the meanings within the context of the related art, and they should not be ideally or excessively formally defined unless the context clearly dictates otherwise.

According to the exemplary embodiment of the present disclosure, a controller may be realized by a nonvolatile memory (not shown), which consists of an algorithm configured to control operations of various components of a vehicle or data regarding software instructions to play the algorithm, and a processor (not shown), which is configured to perform operations described below using the data stored in the memory. The memory and processor may be realized as separate chips. Alternately, the memory and processor may be realized as an integrated single chip. The processor may have one or more forms.

Hereinbelow, an exemplary embodiment of the present disclosure will be described with reference to accompanying drawings.

According to the present disclosure, an apparatus and a method for automatically controlling in-vehicle infotainment volume include: a parking assistance system sensor 10 mounted in a vehicle 1 and detecting an obstacle around the vehicle; an advanced driver assistance systems park (ADAS PRK) 20 calculating a distance between the vehicle and the obstacle located around the vehicle by using the information of the parking assistance system sensor 10; and an in-vehicle infotainment (IVI) head unit 40 receiving the information of the ADAS PRK 20 and automatically adjusting the volume of a sound system 30 mounted in the vehicle, as shown in FIGS. 1 to 4.

Obstacles located around the vehicle may include people, objects, animals, etc.

The parking assistance system sensor 10 includes a parking distance warning (PDW) sensor 11 and a camera sensor 12 that able to detect an obstacle and a space located around the vehicle.

The PDW sensor 11 may be an ultrasonic sensor mounted to a vehicle, and the camera sensor 12 may be a camera used as a parking assistance means to recognize an obstacle around the vehicle in images, and may partially correct a result of the PDW sensor 11 as the parking assistance means.

The parking assistance system sensor 10 and the ADAS PRK 20 may be connected to each other by wireless communications such as local interconnect network (LIN) communication of a vehicle.

The advanced driver assistance systems park 20 (ADAS PRK) calculates a distance between an obstacle (people, objects, etc.) recognized based on the information transmitted from the parking assistance system sensor 10 and the vehicle.

Figure 2:
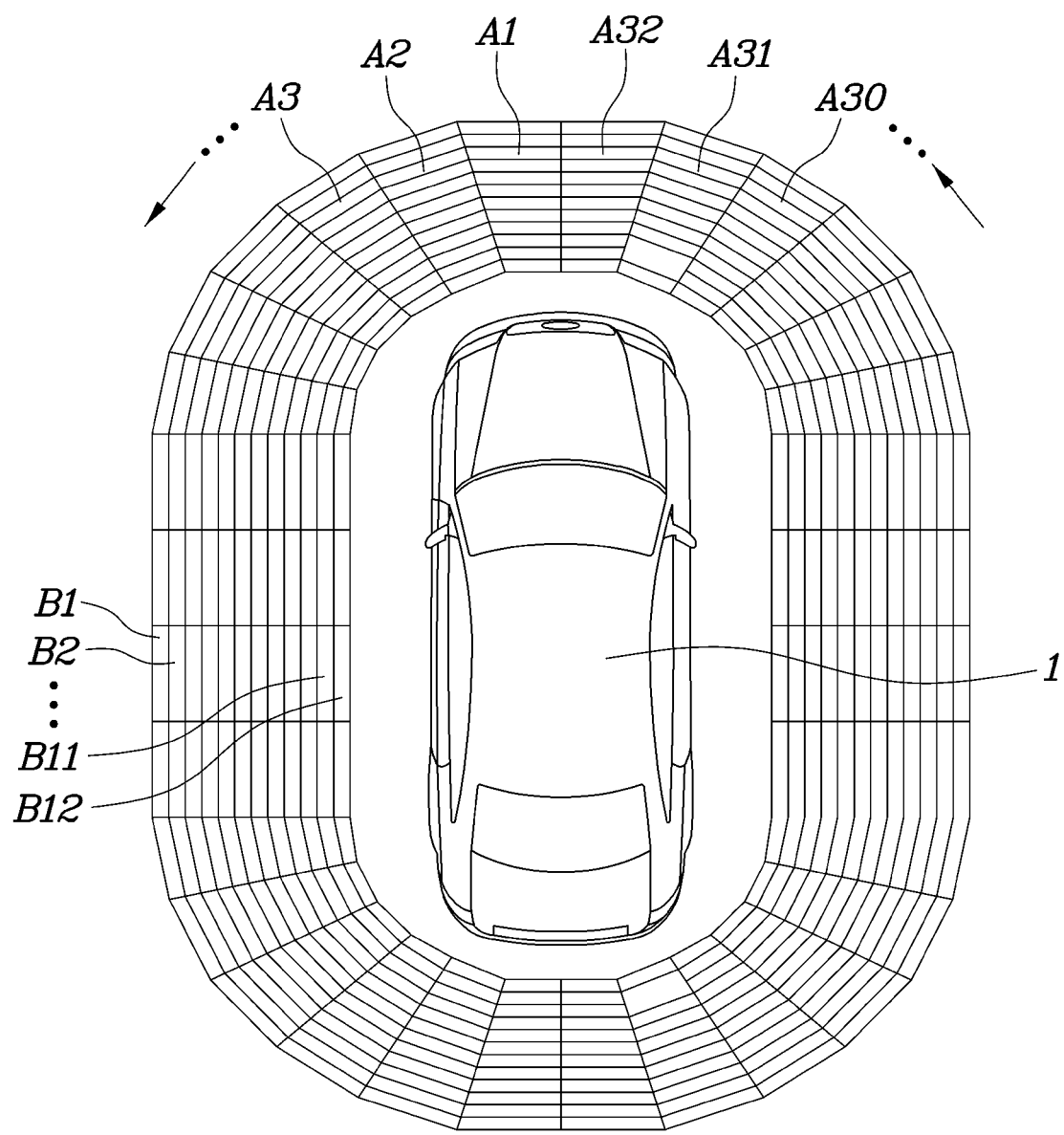
FIG. 2 is a view showing a process in which an ADAS PRK of the present disclosure calculates a distance between a vehicle and an obstacle around the vehicle.

In other words, as shown in FIG. 2, the ADAS PRK 20 presets the surrounding of the vehicle 1 along the omnidirectional circumference of the vehicle by dividing the surrounding of the vehicle into a plurality of sections A1 to A32, calculates a distance value between the vehicle and an obstacle located in each of the sections A1 to A32 based on the information of the parking assistance system sensor 10 to preset the distance value into for each of levels B1 to B12, and stores a distance between the vehicle and an obstacle located closest to the vehicle into a memory and transmits the distance to the IVI head unit 40.

The IVI head unit 40 receives the information of the ADAS PRK 20 and automatically adjust the volume of the sound system 30 mounted to the vehicle, and may adjust the playback volume of the IVI and a level of the warning sound volume by the sound system 30.

Herein, when the playback volume of the IVI is adjusted to be lowered, the warning sound volume is adjusted to be raised in inverse proportion to the lowered playback volume of the IVI, so that the driver can more reliably recognize the warning sound.

Figure 3:
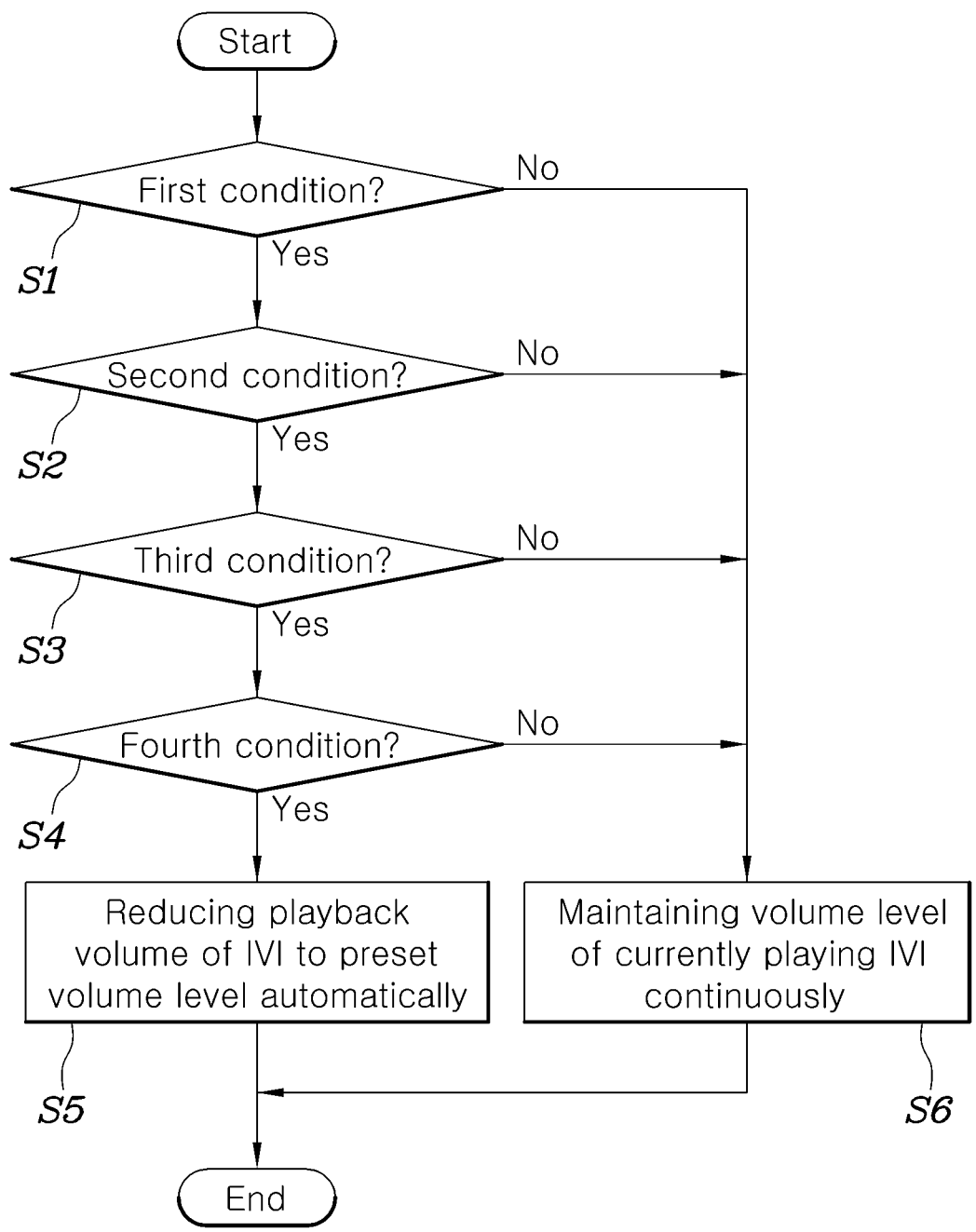
FIGS. 3 to 4 are flowcharts showing the automatic control apparatus and method of the in-vehicle infotainment volume according to the present disclosure.

FIG. 3 is a flowchart showing a condition in which the IVI head unit 40 receiving the information of the ADAS PRK 20 automatically adjust the playback volume of the IVI to be lowered to a preset level by the sound system 30.

In other words, when a first condition (at S1) in which a vehicle-linked volume adjustment function is preset (on) in a set menu of the IVI, a second condition (at S2) in which a volume level the currently playing IVI is higher than a reference level, a third condition (at S3) in which a current vehicle speed is less than or equal to a reference speed, and a fourth condition (at S4) in which the minimum distance value between the vehicle and the obstacle based on the information of the ADAS PRK is less than a reference distance value are all satisfied, the IVI head unit 40 controls the sound system 30 to automatically lower the playback volume of the IVI to the preset volume level (at S5).

In order to achieve the operation of the function, the vehicle-linked volume adjustment function is turned on in the set menu of the IVI. Furthermore, the volume level of the currently playing IVI should be preset higher than the reference level, and since the function is used driving at low speed or at a stop, a vehicle speed should be lower than the reference speed (e.g., 20 km/h), and only when the minimum distance value of the nearest obstacle among the distance values of the obstacles in the sections, which is transmitted from the ADAS PRK 20 is less than the reference distance value, the function is operated, and at this time, the playback volume of the IVI is automatically lowered to the preset volume level (e.g., Lv5) by the control of the IVI head unit 40.

When any one of the first condition (at S1) to the fourth condition (at S4) is not satisfied, the IVI head unit 40 controls the sound system 30 so that the volume level (e.g., Lv20) of the currently playing IVI is continuously maintained (at S6).

Figure 4:
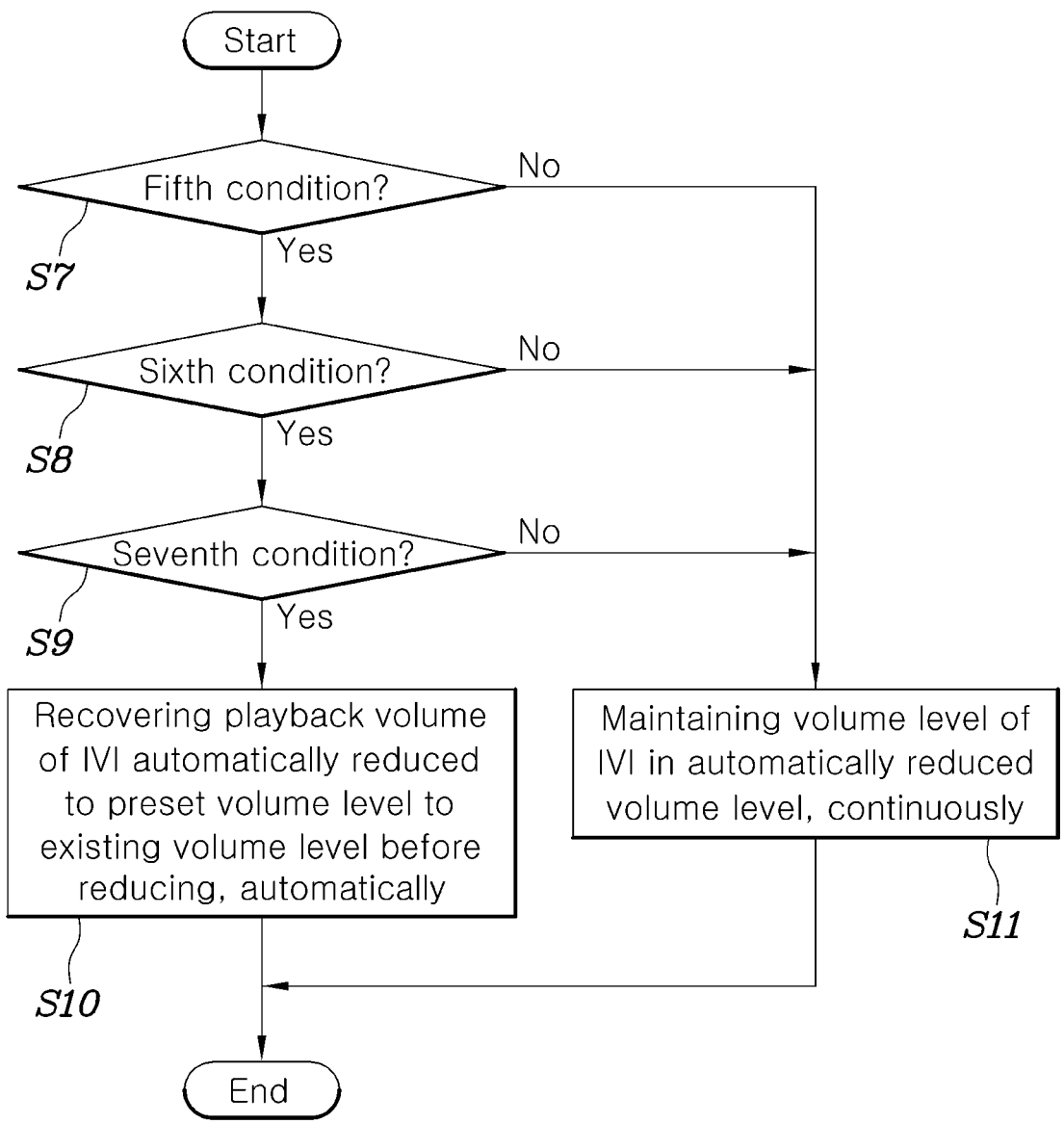

FIG. 4 is a flowchart showing a condition in which the playback volume of the IVI automatically reduced to the preset volume level (e.g., Lv5) is automatically recovered to the initial volume level (e.g., Lv20) before being reduced.

In other words, a fifth condition in which the volume level of the currently playing IVI is adjusted to be automatically lowered to the preset volume level by the IVI head unit 40 (at S7), a sixth condition in which the volume level of the IVI without a change in volume level by manipulation of the user after the volume level being adjusted to be automatically lowered by the IVI head unit 40 (at S8), and a seventh condition in which the minimum distance value between the vehicle and the obstacle, the value being transmitted from the ADAS PRK 20, is larger than the reference distance value (at S9) are all satisfied, the playback volume of the IVI is adjusted to be automatically recovered to the existing volume level (e.g., Lv20) before being lowered by the IVI head unit 40 (at S10).

The automatically lowered playback volume of the IVI may be automatically recovered to the existing volume level when the user manipulation is not input after the volume level is lowered, and in order to recover the existing volume level, the function is performed only when the minimum distance value of the nearest obstacle, among the distance values of the obstacles in the plurality of sections from the ADAS PRK 20, is larger than the reference distance value (when the nearest obstacle is farther than the reference distance value), and the playback volume of the IVI is recovered to be automatically raised to the existing volume level (e.g., Lv20) before being lowered by control of the IVI head unit 40.

When any one of the fifth condition (at S7) to the seventh condition (at S9) is not satisfied, the IVI head unit 40 controls the sound system 30, so that the volume level of the currently playing IVI is continuously maintained in the automatically lowered volume level (e.g., Lv5) (at S11).

The sound system 30 used in the present disclosure may include an amplifier and a speaker mounted in the vehicle.

As described above, according to the embodiment of the present disclosure, the automatic control apparatus and method are configured to use the parking assistance system sensor 10 to detect an obstacle (people, object, etc.) around the vehicle, and to adjust the playback volume of the IVI to be automatically lowered when an obstacle is detected. Accordingly, the safety while driving can be further enhanced, and specifically, the safety of a driver and pedestrians can be increased, and the convenience of the driver can be improved.

Furthermore, according to the embodiment of the present disclosure, the automatic control apparatus and method are configured to automatically adjust the playback volume of the IVI not only in reversing but also in forward moving through the sound system 30 controlled by the IVI head unit 40, so that the safety while driving can be further enhanced.

Although the preferred embodiment of the present disclosure has been disclosed in detail only with respect to the above specific embodiments, those skilled in the art will appreciate that various modifications, additions, and substitutions are possible, without departing from the spirit and scope of the present disclosure, and it is appropriate that the various modifications, additions, and substitutions belong to the accompanying claims.

What is claimed is:

1. An automatic control apparatus for in-vehicle infotainment volume, the automatic control apparatus comprising:

a parking assistance system sensor adapted to be mounted in a vehicle and configured to detect an obstacle around the vehicle;

an advanced driver assistance systems park (ADAS PRK) configured to calculate a distance between the vehicle and the obstacle by using information of the parking assistance system sensor; and an in-vehicle infotainment head unit configured to receive information of the ADAS PRK and to automatically control volume of a sound system mounted in the vehicle, wherein the ADAS PRK is configured to preset a surrounding of the vehicle by dividing the surrounding of the vehicle into a plurality of sections along an omnidirectional circumference of the vehicle, and to calculate a distance value between the vehicle and an obstacle located in each of the sections based on the information of the parking assistance system sensor to preset the distance value for each level, and to store a distance between the vehicle and an obstacle located closest to the vehicle in each section into a memory to transmit the distance to the head unit.

2. The automatic control apparatus of claim 1, wherein the parking assistance system sensor comprises an ultrasonic sensor and a camera sensor that are configured to detect the obstacle and a space around the vehicle.

3. The automatic control apparatus of claim 1, wherein the head unit is configured to adjust a playback volume of an in-vehicle infotainment (IVI) and warning sound volume by the sound system.

4. The automatic control apparatus of claim 3, wherein when the playback volume of the IVI is adjusted to be lowered, the warning sound volume is adjusted to be raised in inverse proportion to the lowered playback volume of the IVI.

5. The automatic control apparatus of claim 3, wherein the head unit is configured to control the sound system such that a playback volume of the IVI is lowered to a preset volume level automatically, when a first condition in which a vehicle-linked volume adjustment function is preset in a set menu of the IVI, a second condition in which a volume level of a currently playing IVI is higher than a reference level, a third condition in which a current vehicle speed is less than or equal to a reference speed, and a fourth condition in which a minimum distance value between the vehicle and the obstacle, the distance value being transmitted from the ADAS PRK, is less than a reference distance value are all satisfied.

6. The automatic control apparatus of claim 5, wherein when any one of the first to fourth conditions is unsatisfied, the head unit controls the sound system to continuously maintain the volume level of the currently playing IVI.

7. The automatic control apparatus of claim 5, wherein when a fifth condition in which the volume level of the currently playing IVI is adjusted to be automatically lowered to the volume level preset by the head unit, a sixth condition without a change in volume level by manipulation of a user after the volume level of the IVI is adjusted to be automatically lowered by the head unit, and a seventh condition in which the minimum distance value between the vehicle and the obstacle transmitted from the ADAS PRK is larger than the reference distance value are all satisfied, the playback volume of the IVI is automatically recovered to an existing volume level before being lowered by the head unit.

8. The automatic control apparatus of claim 7, wherein when any one of the fifth condition to the seventh condition is unsatisfied, the head unit controls the volume level of the IVI to be continuously maintained in the automatically lowered volume level.

9. The automatic control apparatus of claim 1, wherein the sound system comprises an amplifier and a speaker mounted in the vehicle.

10. An automatic control method of in-vehicle infotainment volume, the automatic control method comprising:
   detecting an obstacle around a vehicle by using an ultrasonic sensor and a camera sensor mounted in the vehicle;
   calculating, by an advanced driver assistance systems park (ADAS PRK), a distance between the vehicle and the obstacle when the obstacle is detected around the vehicle; and
   automatically adjusting, by an in-vehicle infotainment head unit receiving information from the ADAS PRK, a volume of a sound system mounted in the vehicle,
   wherein the ADAS PRK is configured to preset a surrounding of the vehicle by dividing the surrounding of the vehicle into a plurality of sections along omnidirectional circumference of the vehicle, and to calculate a distance value between the vehicle and an obstacle located in each of the sections based on the information of the ultrasonic sensor and the camera sensor to preset the distance value for each level, and to store a distance between the vehicle and an obstacle located closest to the vehicle for each section into a memory and to transmit the distance to the head unit.

11. The automatic control method of claim 10, wherein a playback volume of an in-vehicle infotainment (IVI) and a warning sound volume are automatically adjusted by the sound system.

12. The automatic control method of claim 11, wherein when the playback volume of the IVI is adjusted to be lowered, the warning sound volume is adjusted to be raised in inverse proportion to the lowered playback volume of the IVI.

13. The automatic control method of claim 11, wherein when a first condition in which a vehicle-linked volume adjustment function is preset in a set menu of the IVI, a second condition in which a volume level of a currently playing IVI is higher than a reference level, a third condition in which a current vehicle speed is less than or equal to a reference speed, and a fourth condition in which a minimum distance value between the vehicle and an obstacle, the distance value being transmitted from the ADAS PRK, is less than a reference distance value are all satisfied, the playback volume of the IVI is controlled to be lowered to the preset volume level automatically.

14. The automatic control method of claim 13, wherein when any one of the first condition to the fourth condition is unsatisfied, the volume level of the currently playing IVI is continuously maintained.

15. The automatic control method of claim 13, wherein when a fifth condition in which the volume level of the currently playing IVI is adjusted to be automatically lowered to the volume level preset by the head unit, a sixth condition without a change in volume level by manipulation of a user after the volume level of the IVI is adjusted to be automatically lowered by the head unit, and a seventh condition in which a minimum distance value between the vehicle and an obstacle transmitted from the ADAS PRK is larger than the reference distance value are all satisfied, the playback volume of the IVI is automatically recovered to an existing volume level before being lowered.

16. The automatic control method of claim 15, wherein when any one of the fifth condition to the seventh condition is unsatisfied, the volume level of the IVI is continuously maintained in the automatically lowered volume level.

17. The automatic control method of claim 11, wherein the playback volume of the IVI is automatically adjusted in both reversing and forward moving of the vehicle.

* * * * *